(12) United States Patent
Chan et al.

(10) Patent No.: US 7,772,114 B2
(45) Date of Patent: Aug. 10, 2010

(54) METHOD FOR IMPROVING UNIFORMITY AND ADHESION OF LOW RESISTIVITY TUNGSTEN FILM

(75) Inventors: Lana Hiului Chan, Santa Clara, CA (US); Feng Chen, Milpitas, CA (US); Karl B. Levy, Los Altos, CA (US)

(73) Assignee: Novellus Systems, Inc., San Jose, CA (US)

( * ) Notice: Subject to any disclaimer, the term of this patent is extended or adjusted under 35 U.S.C. 154(b) by 62 days.

(21) Appl. No.: 11/951,236

(22) Filed: Dec. 5, 2007

(65) Prior Publication Data

US 2009/0149022 A1    Jun. 11, 2009

(51) Int. Cl.
*H01L 21/443* (2006.01)
(52) U.S. Cl. .................. 438/656; 438/680; 438/685; 257/E21.168
(58) Field of Classification Search ........... 257/E21.168
See application file for complete search history.

(56) References Cited

U.S. PATENT DOCUMENTS

| | | | |
|---|---|---|---|
| 4,804,560 A | 2/1989 | Shioya et al. |
| 5,028,565 A | 7/1991 | Chang et al. |
| 5,227,329 A | 7/1993 | Kobayashi et al. |
| 5,250,329 A | 10/1993 | Miracky et al. |
| 5,326,723 A | 7/1994 | Petro et al. |
| 5,391,394 A | 2/1995 | Hansen |
| 5,661,080 A | 8/1997 | Hwang et al. |
| 5,726,096 A | 3/1998 | Jung |
| 5,795,824 A | 8/1998 | Hancock |
| 5,804,249 A | 9/1998 | Sukharev et al. |
| 5,817,576 A | 10/1998 | Tseng et al. |
| 5,956,609 A | 9/1999 | Lee et al. |
| 6,001,729 A | 12/1999 | Shinriki et al. |
| 6,017,818 A | 1/2000 | Lu |
| 6,037,263 A | 3/2000 | Chang |
| 6,066,366 A | 5/2000 | Berenbaum et al. |
| 6,099,904 A | 8/2000 | Mak et al. |
| 6,107,200 A | 8/2000 | Takagi et al. |
| 6,143,082 A | 11/2000 | McInerney et al. |
| 6,174,812 B1 | 1/2001 | Hsiung et al. |
| 6,206,967 B1 | 3/2001 | Mak et al. |
| 6,245,654 B1 | 6/2001 | Shih et al. |
| 6,265,312 B1 | 7/2001 | Sidhwa et al. |

(Continued)

FOREIGN PATENT DOCUMENTS

WO    WO01/27347    4/2001

OTHER PUBLICATIONS

Lee et al., PCT Search Report, Completed Oct. 15, 2004, PCT/US2004/006940, Int'l filing date May 3, 2004.

(Continued)

*Primary Examiner*—Stephen W Smoot
(74) *Attorney, Agent, or Firm*—Weaver Austin Villeneuve & Sampson LLP

(57) ABSTRACT

Methods of improving the uniformity and adhesion of low resistivity tungsten films are provided. Low resistivity tungsten films are formed by exposing the tungsten nucleation layer to a reducing agent in a series of pulses before depositing the tungsten bulk layer. According to various embodiments, the methods involve reducing agent pulses with different flow rates, different pulse times and different interval times.

15 Claims, 10 Drawing Sheets

U.S. PATENT DOCUMENTS

| | | | |
|---|---|---|---|
| 6,277,744 B1 | 8/2001 | Yuan et al. | |
| 6,294,468 B1 | 9/2001 | Gould-Choquette et al. | |
| 6,297,152 B1 | 10/2001 | Itoh et al. | |
| 6,309,966 B1 | 10/2001 | Govindarajan et al. | |
| 6,355,558 B1 | 3/2002 | Dixit et al. | |
| 6,404,054 B1 | 6/2002 | Oh et al. | |
| 6,551,929 B1 | 4/2003 | Kori et al. | |
| 6,566,250 B1 | 5/2003 | Tu et al. | |
| 6,566,262 B1 | 5/2003 | Rissman et al. | |
| 6,607,976 B2 | 8/2003 | Chen et al. | |
| 6,635,965 B1 | 10/2003 | Lee et al. | |
| 6,706,625 B1 | 3/2004 | Sudijono et al. | |
| 6,720,261 B1 | 4/2004 | Anderson et al. | |
| 6,740,585 B2 | 5/2004 | Yoon et al. | |
| 6,797,340 B2 | 9/2004 | Fang et al. | |
| 6,844,258 B1 | 1/2005 | Fair et al. | |
| 6,861,356 B2 | 3/2005 | Matsuse et al. | |
| 6,902,763 B1 | 6/2005 | Elers et al. | |
| 6,936,538 B2 | 8/2005 | Byun | |
| 6,939,804 B2 * | 9/2005 | Lai et al. | 438/680 |
| 6,962,873 B1 | 11/2005 | Park | |
| 7,005,372 B2 | 2/2006 | Levy et al. | |
| 7,141,494 B2 | 11/2006 | Lee et al. | |
| 7,262,125 B2 | 8/2007 | Wongsenakhum et al. | |
| 7,429,402 B2 | 9/2008 | Gandikota et al. | |
| 2001/0008808 A1 | 7/2001 | Gonzalez | |
| 2001/0014533 A1 | 8/2001 | Sun | |
| 2001/0015494 A1 | 8/2001 | Ahn | |
| 2001/0044041 A1 | 11/2001 | Badding et al. | |
| 2002/0090796 A1 | 7/2002 | Desai et al. | |
| 2002/0177316 A1 | 11/2002 | Miller et al. | |
| 2003/0059980 A1 | 3/2003 | Chen et al. | |
| 2003/0104126 A1 | 6/2003 | Fang et al. | |
| 2003/0127043 A1 | 7/2003 | Lu et al. | |
| 2004/0044127 A1 | 3/2004 | Okubo et al. | |
| 2004/0206267 A1 | 10/2004 | Sambasivan et al. | |
| 2005/0136594 A1 | 6/2005 | Kim | |
| 2006/0094238 A1 | 5/2006 | Levy et al. | |
| 2008/0124926 A1 | 5/2008 | Chan et al. | |
| 2009/0149022 A1 | 6/2009 | Chan et al. | |

OTHER PUBLICATIONS

Lee et al., Written Opinion, Completed Oct. 15, 2004, PCT/US2004/006940, Int'l filing date May 3, 2004.

George et al., "Surface Chemistry for atomic Layer Growth", J. Phys. Chem, 1996, vol. 100, No. 31, pp. 13121-13131.

Bell et al., "Batch Reactor Kinetic Studies of Tungsten LPCVD from Silane and Tungsten Hexafluoride", J. Electrochem. Soc., Jan. 1996, vol. 143, No. 1, pp. 296-302.

Klaus et al., "Atomic layer deposition of tungsten using sequential surface chemistry with a sacrificial stripping reaction", Thin Solid Films 360 (2000) 145-153.

Klaus et al., "Atomically Controlled Growth of Tungsten and Tungsten Nitride Using Sequential Surface Reactions," Applied Surface Science, 162-163, (2000) 479-491.

Li et al., "Deposition of $WN_xC_y$ Thin Films by ALCVD™ Method for Diffusion Barriers in Metallization," IITC Conference Report, 2002, 3 Pages.

Elam et al, "Nucleation and Growth During Tungsten Atomic Layer Deposition on $SiO_2$ Surfaces," Thin Solid Films, 2001, 13 Pages.

Collins et al., "Pulsed Deposition of Ultra Thin Tungsten for Plugfill of High Aspect Ratio Contacts," Presentation made at Semicon Korea 2003, Jan. 21, 2003, 9 pages.

Collins, et al., "Pulsed Deposition of Ultra Thin Tungsten for Plugfill of High Aspect Ratio Contacts," Semiconductor Equipment and Materials International, Semicon Korea, Jan. 21, 2003, 3 pages.

Lee et al., Pulsed Deposition of Ultra Thin Tungsten and its Application for Plugfill of High Aspect Ratio Contacts, Abstract, Jan. 21, 2003, 1 page.

U.S. Office Action mailed Jul. 12, 2005, from U.S. Appl. No. 10/815,560.

U.S. Office Action mailed Jul. 17, 2002, from U.S. Appl. No. 09/975,074.

U.S. Office Action mailed Feb. 8, 2005, from U.S. Appl. No. 10/649,351.

U.S. Office Action mailed Jul. 14, 2005, from U.S. Appl. No. 10/649,351.

Presentation by Inventor James Fair: "Chemical Vapor Deposition of Refractory Metal Silicides," 27 Pages, 1983.

Saito et al., "A Novel Copper Interconnection Technology Using Self Aligned Metal Capping Method," IEEE, 3 Pages, 2001.

U.S. Office Action mailed Jun. 22, 2004, from U.S. Appl. No. 10/435,010.

U.S. Office Action mailed Mar. 23, 2005, from U.S. Appl. No. 10/690,492.

U.S. Office Action mailed Nov. 23, 2005, from U.S. Appl. No. 10/984,126.

Chan et al., "Methods for Growing Low-Resistivity Tungsten Film", Novellus Systems, Inc., filed Nov. 1, 2005, U.S. Appl. No. 11/265,531, pp. 1-35.

Levy et al., "Deposition of Tungsten Nitride", Novellus Systems, Inc., filed Dec. 16, 2005, U.S. Appl. No. 11/305,368, pp. 1-39.

U.S. Office Action mailed Dec. 28, 2005, from U.S. Appl. No. 10/815,560.

U.S. Office Action mailed Dec. 30, 2005, from U.S. Appl. No. 10/649,351.

Wongsenakhum et al., "Reducing Silicon Attack and Improving Resistivity of Tungsten Nitride Film", Novellus Systems, Inc., filed Feb. 6, 2006, U.S. Appl. No. 11/349,035, pp. 1-26.

U.S. Office Action mailed Apr. 17, 2006, from U.S. Appl. No. 10/815,560.

U.S. Office Action mailed May 17, 2006, from U.S. Appl. No. 10/984,126.

U.S. Office Action mailed Sep. 28, 2006, from U.S. Appl. No. 10/815,560.

Gao et al., "Methods for Improving Uniformity and Resistivity of Thin Tungsten Films," Novellus Systems, Inc, filed Jul. 24, 2007, U.S. Appl. No. 11/782,570, pp. 1-23.

Chan et al., "Methods for Growing Low-Resistivity Tungsten for High Aspect Ratio and Small Features," Novellus Systems, Inc., U.S. Appl. No. 12/030,645, filed Feb. 13, 2008.

Humayun et al., "Methods for Forming All Tungsten Contacts and Lines," Novellus Systems, Inc., U.S. Appl. No. 11/963,698, filed Dec. 21, 2007.

Notice of Allowance and Fee Due mailed Mar. 12, 2003, from U.S. Appl. No. 09/975,074.

Allowed Claims from U.S. Appl. No. 09/975,074, Mar. 2003.

Notice of Allowance and Fee Due mailed Jul. 21, 2006, from U.S. Appl. No. 10/649,351.

Allowed Claims from U.S. Appl. No. 10/649,351, May 2006.

Notice of Allowance and Fee Due mailed Oct. 7, 2004, from U.S. Appl. No. 10/435,010.

Allowed Claims from U.S. Appl. No. 10/435,010, Sep. 2004.

Notice of Allowance and Fee Due mailed Aug. 25, 2006, from U.S. Appl. No. 10/984,126.

Notice of Allowance and Fee Due mailed Sep. 14, 2005, from U.S. Appl. No. 10/690,492.

Allowed Claims from U.S. Appl. No. 10/690,492, Jun. 2005.

Notice of Allowance and Fee Due mailed Apr. 24, 2007, from U.S. Appl. No. 10/815,560.

Allowed Claims from U.S. Appl. No. 10/815,560, Jul. 2006.

U.S. Office Action mailed Jun. 27, 2008, from U.S. Appl. No. 11/305,368.

U.S. Office Action mailed Aug. 21, 2008, from U.S. Appl. No. 11/265,531.

Ashtiani et al., "Ternary Tungsten-Containing Thin Film Heater Elements," Novellus Systems, Inc., U.S. Appl. No. 61/025,237, filed Jan. 31, 2008.

Chen et al., "Method for Reducing Tungsten Roughness and Improving Reflectivity," Novellus Systems, Inc., U.S. Appl. No. 12/202,126, filed Aug. 29, 2008.

U.S. Office Action mailed Oct. 16, 2008, from U.S. Appl. No. 11/349,035.

U.S. Office Action mailed Sep. 29, 2008, from U.S. Appl. No. 11/782,570.

Ashtiani et al., "Ternary Tungsten-Containing Thin Films," Novellus Systems, Inc., U.S. Appl. No. 12/363,330, filed Jan. 30, 2009.

Chandrashekar et al., "Method for depositing thin tungsten film with low resistivity and robust micro-adhesion characteristics," Novellus Systems, Inc., U.S. Appl. No. 61/061,078, filed Jun. 12, 2008.

U.S. Final Office Action mailed Apr. 28, 2009, from U.S. Appl. No. 11/782,570.

U.S. Office Action mailed Apr. 3, 2009, from U.S. Appl. No. 11/305,368.

U.S. Final Office Action mailed Feb. 26, 2009, from U.S. Appl. No. 11/265,531.

U.S. Notice of Allowance mailed May 4, 2009 from U.S. Appl. No. 11/265,531.

Allowed Claims from U.S. Appl. No. 11/265,531, May 4, 2009.

U.S. Final Office Action mail Feb. 25, 2009, from U.S. Appl. No. 11/349,035.

U.S. Office Action mailed Jun. 11, 2009, from U.S. Appl. No. 11/963,698.

U.S. Office Action mailed Jun. 4, 2009, from U.S. Appl. No. 11/349,035.

Ken K. Lai and H. Henry Lamb, Precursors for Organometallic Chemical Vapor Deposition of Tungsten Carbide Films, 1995, Chemistry Material, pp. 2284-2292.

U.S. Office Action mailed Jun. 24, 2009 from U.S. Appl. No. 12/030,645.

Chandrashekar et al., "Method for Depositing Thin Tungsten Film With Low Resistivity and Robust Micro-Adhesion Characteristics," Novellus Systems, Inc., U.S. Appl. No. 12/407,541, filed Mar. 19, 2009.

U.S. Office Action mailed Oct. 21, 2009 from U.S. Appl. No. 12/202,126.

* cited by examiner

METHOD FOR IMPROVING UNIFORMITY AND ADHESION OF LOW RESISTIVITY TUNGSTEN FILM

FIELD OF INVENTION

This invention relates to methods for preparing tungsten films. Embodiments of the invention are particularly useful for integrated circuit applications that require thin tungsten films having low electrical resistivity with good uniformity and good adhesion.

BACKGROUND

The deposition of tungsten films using chemical vapor deposition (CVD) techniques is an integral part of many semiconductor fabrication processes. Tungsten films may be used as low resistivity electrical connections in the form of horizontal interconnects, vias between adjacent metal layers, and contacts between a first metal layer and the devices on the silicon substrate. In a conventional tungsten deposition process, the wafer is heated to the process temperature in a vacuum chamber, and then a very thin portion of tungsten film, which serves as a seed or nucleation layer, is deposited. Thereafter, the remainder of the tungsten film (the bulk layer) is deposited on the nucleation layer. Conventionally, the tungsten bulk layer is formed by the reduction of tungsten hexafluoride ($WF_6$) with hydrogen ($H_2$) on the growing tungsten layer. The tungsten bulk layer is generally deposited more rapidly than the nucleation layer, but cannot be produced easily and reliably without first forming the nucleation layer.

Advancing technology requires that tungsten electrical connections be increasingly thin yet maintain very low resistivity. Hence, it is critical that tungsten deposition process provide tungsten films having very low resistivity. The uniformity of the film properties across wafers is also critical to improving yield as wafer size continues to increase.

SUMMARY OF INVENTION

Methods of forming low resistivity tungsten films with good uniformity and good adhesion to the underlying layer are provided. Low resistivity tungsten films are formed by exposing the tungsten nucleation layer to a reducing agent before depositing the tungsten bulk layer. By exposing the tungsten nucleation layer to multiple sequential reducing agent pulses, e.g., instead of a single reducing agent pulse, a tungsten film with both good uniformity and good adhesion as well as low resistivity is formed.

In one aspect of the invention, a tungsten film is formed by exposing the tungsten nucleation layer to pulses of reducing agent before the tungsten bulk layer is deposited. Depositing the tungsten film includes (a) positioning the substrate in a reaction chamber, (b) depositing a tungsten nucleation layer on the substrate, (c) exposing the nucleation layer to a plurality of reducing agent pulses without an intervening pulse operation between the pulses and (d) depositing a tungsten bulk layer over the tungsten nucleation layer to form the tungsten film.

In some embodiments of methods following the above sequence, the reducing agent is a boron-containing reducing agent, and in some embodiments the reducing agent is diborane. In some embodiments, the number of reducing agent pulses in step (c) is 2 to 8. In further embodiments, the substrate is heated to between about 375 C to 415 C and the temperature is allowed to stabilize prior to the reducing agent pulses. In some embodiments, the substrate is heated to between about 375 C to 415 C prior to depositing a tungsten bulk layer over the tungsten nucleation layer. In some embodiments, prior to depositing a tungsten bulk layer over the tungsten nucleation layer, the nucleation layer is exposed to a tungsten-containing precursor.

According to various embodiments of the tungsten film formation process, each pulse in the plurality of reducing agent pulses in step (c) has a pulse time and the pulse time is between about 0.5 to 5 seconds. The pulse times can vary among the reducing agent pulses. In some embodiments, the interval time between reducing agent pulses is between about 2 to 5 seconds. The interval times between reducing agent pulses can also vary among the intervals. In some embodiments, the interval time between reducing agent pulses decreases with each subsequent reducing agent pulse. In further embodiments, each pulse in the plurality of reducing agent pulses has a flow rate and the flow rate is between about 100 to 500 sccm. The flow rates can also vary among the reducing agent pulses.

In some embodiments of the above methods, the 500 Angstrom thick tungsten film formed on the substrate has a sheet resistance percent non-uniformity of less than 5% and/or a resistivity of less than 12 micro-ohms-cm.

In another embodiment, the tungsten film deposition process includes (a) positioning the substrate in a reaction chamber, (b) depositing a tungsten nucleation layer on the substrate via a pulsed nucleation layer process, (c) heating the substrate to about 395 C and allowing the temperature to stabilize, (d) exposing the nucleation layer, while maintaining the substrate temperature at about 395 C, with 2 to 8 pulses of diborane, the diborane having a flow rate of between about 100 to 500 sccm, a pulse time between about 0.5 to 5 seconds, and a interval time between about 2 to 5 seconds without an intervening pulse operation between the pulses, (e) maintaining the substrate temperature at about 395 C, (f) exposing the nucleation layer to a tungsten-containing precursor, and (g) depositing a tungsten bulk layer over the tungsten nucleation layer.

In an embodiment of an apparatus for depositing tungsten films on a substrate, the apparatus includes a multistation substrate deposition chamber and a controller for controlling the operations in the multistation deposition chamber. The multistation substrate deposition chamber includes a tungsten nucleation layer deposition station, a reducing agent exposure station, and a tungsten bulk layer deposition station. The controller may controls the operations of pulsing alternating reducing agent pulses and tungsten-containing precursor pulses in the tungsten nucleation layer deposition station to deposit a nucleation layer, pulsing a plurality of reducing agent pulses without an intervening pulse operation between the pulses in the reducing agent exposure station, and releasing a tungsten-containing precursor and reducing agent in the tungsten bulk layer deposition station to deposit all or part of a tungsten bulk layer. In certain embodiments, the controller controls transferring a substrate from the tungsten nucleation layer deposition station to the reducing agent station, and from the reducing agent station to the tungsten bulk layer deposition station.

These and other features and advantages of the invention will be described in more detail below with reference to the associated drawings.

BRIEF DESCRIPTION OF THE DRAWINGS

The following detailed description can be more fully understood when considered in conjunction with the drawings in which.

DETAILED DESCRIPTION

Introduction

In the following description, numerous specific details are set forth in order to provide a thorough understanding of the invention, which pertains to forming tungsten films. Preferred methods involve exposing a tungsten nucleation layer to pulses of a reducing agent, which will be described in detail below. Modifications, adaptations or variations of specific methods and of structures shown herein will be apparent to those skilled in the art and are within the scope of this invention.

In general, a nucleation layer is a thin conformal layer that facilitates the subsequent formation of a bulk material thereon. Efficient tungsten deposition processes require tungsten nucleation layers, but these layers typically have higher electrical resistivities than the tungsten bulk layers. Thus, to keep the electrical resistivity of the overall tungsten film (the tungsten nucleation layer and the tungsten bulk layer) low, the tungsten nucleation layer should be kept as thin as possible. On the other hand, the tungsten nucleation layer should be sufficiently thick to fully cover the underlying substrate to support high quality bulk deposition.

Resistivity is an intrinsic property of a material and a measurement of a material's resistance to the movement of charge through the material. The resistivity of a material affects the electrical operation of an integrated circuit. Low resistivity tungsten films minimize power losses and overheating in integrated circuit designs. In addition, it is desirable that a tungsten film have good resistance uniformity across a wafer and good adhesion to the underlying material.

Methods described herein involve forming a tungsten film by way of a tungsten nucleation layer. In certain embodiments, the nucleation layer is exposed to pulses of a reducing agent prior to depositing the tungsten bulk layer. The resulting tungsten film generally has a lower resistivity, better uniformity and better adhesion than a tungsten film formed without exposing the nucleation layer to reducing agent pulses.

Aspects of certain embodiments of the invention are described below in more detail.

Processes

In the processes described herein, a tungsten nucleation layer is exposed to one or more pulses of a reducing agent prior to the bulk tungsten deposition on the nucleation layer. This may be thought of as a nucleation layer surface treatment. Exposure to the reducing agent pulse(s) improves the resistivity of the overall tungsten film (nucleation layer and bulk layer).

Figure 1A:
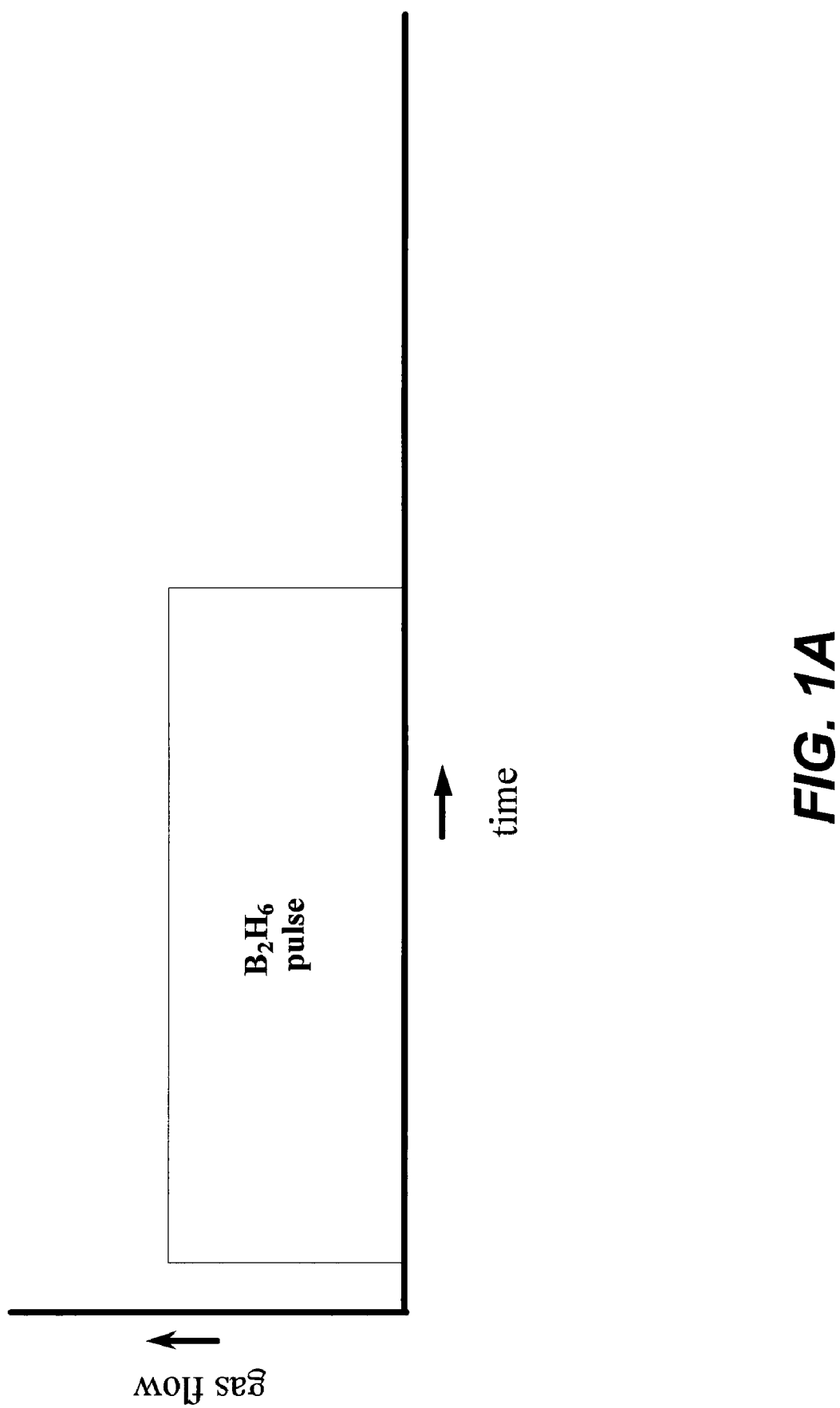
FIGS. 1A-1C are graphs representing reducing agent pulses and interval times according to various embodiments of the invention.

FIG. 1A is a graph representing a single reducing agent pulse for a tungsten nucleation layer. The vertical axis represents gas flow rate and the horizontal axis represents time, as divided into stages associated with the various steps of the process. After a tungsten nucleation layer is deposited on a substrate, the nucleation layer is exposed to a single reducing agent pulse, as shown in FIG. 1A. A tungsten bulk layer is then deposited on the nucleation layer (not shown). Although the example shown in FIG. 1A uses diborane as the reducing agent, other reducing agents may be used, including silanes and other boranes.

Generally, a tungsten film formed after a reducing agent treatment to the nucleation layer has a lower resistivity but a poorer sheet resistance uniformity (i.e., higher percent non-uniformity) than a tungsten film formed without the nucleation layer being exposed to a reducing agent. Typical resistivities and percent non-uniformities of a 500 Angstrom thick tungsten film formed (a) using a single reducing agent pulse as shown in FIG. 1A and (b) without exposing the nucleation layer to a reducing agent are shown below in Table I.

TABLE I

Typical resistivities and uniformities of 500 Angstrom thick tungsten films formed with and without exposing the nucleation layer to a reducing agent.

| Process | Resistivity (μohm-cm) | Non-Uniformity (% NU) |
|---|---|---|
| No reducing agent treatment | >20 | <5 |
| Single pulse reducing agent treatment | <15 | >10 |

As shown in Table I, the typical resistivity of a tungsten film formed without a reducing agent treatment is greater than the typical resistivity of a film formed using a single reducing agent pulse as shown in FIG. 1A. However, the sheet resistance uniformity of a tungsten film formed without a reducing agent treatment is generally better than that of a film formed with a single pulse reducing agent treatment. The resistivity of a tungsten film formed with a single pulse reducing agent treatment can be decreased even further by increasing reducing agent exposure (i.e., longer pulse time and/or increased gas flow), but adhesion (not shown in Table I) of the tungsten film to the underlying layer decreases with increasing reducing agent exposure in a single pulse.

Figure 1B:
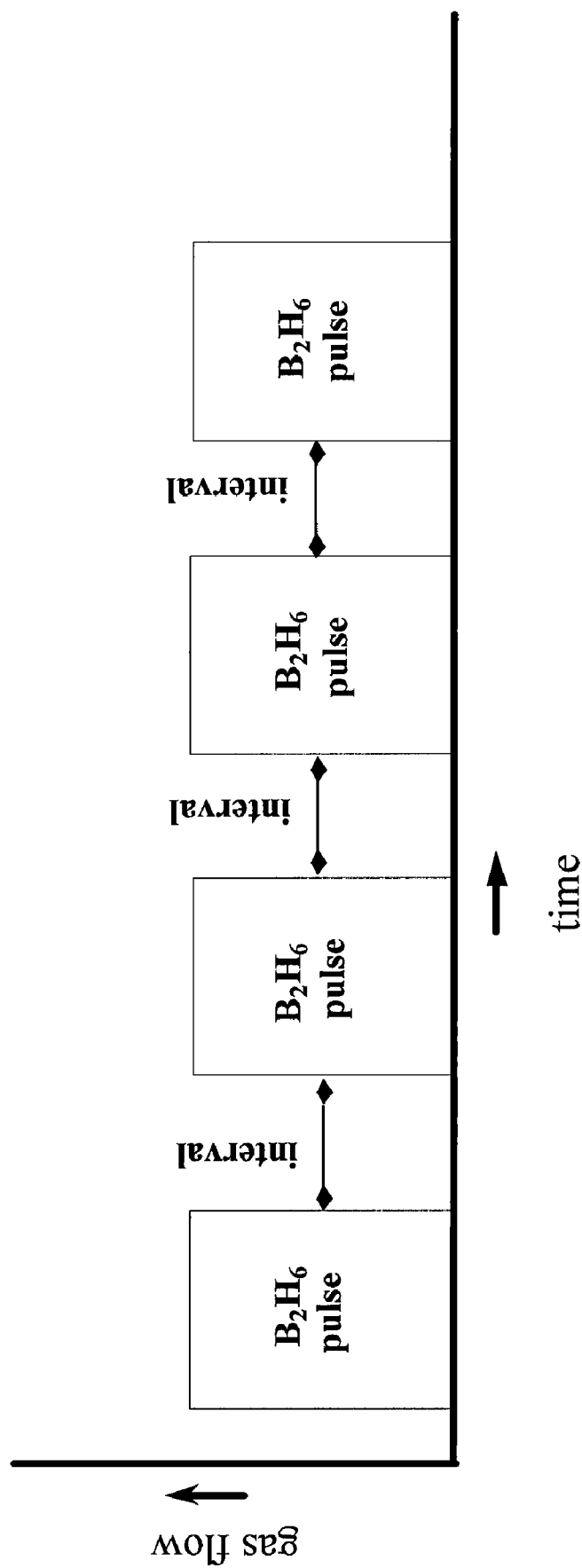

FIG. 1B a graph representing reducing agent pulses and interval times in accordance with certain embodiments of the invention. The vertical axis represents gas flow rate and the horizontal axis represents time, as divided into stages associated with the various steps of the process. A deposited nucleation layer is exposed to multiple reducing agent pulses with interval times between the pulses. During an interval, no reducing agent flows into the reaction chamber, as shown in FIG. 1B. As above, the reducing agent in this example is diborane, though other reducing agents may be used.

A multi-pulse treatment, such as that shown in FIG. 1B, results in unexpected improvements in tungsten resistivity and uniformity. Table II shows the properties of approximately 510 Angstrom thick tungsten films deposited on titanium nitride barrier layers on 300 mm wafers. The reducing agent used for the reducing agent treatment was diborane. The diborane dosages for each wafer are equivalent, i.e., 1 pulse for 6 seconds and 6 pulses for 1 second both equal 6 seconds of exposure time to diborane. Resistivity, percent non-uniformity, and adhesion were measured. Adhesion was measured via a scribe/tape test. In a scribe/tape test, the tungsten film is scribed with a diamond cutter, tape is placed over the scribed area, and then the tape is pulled off. "Pass" for adhesion indicates that the tungsten film remained on the titanium nitride barrier layer after a scribe/tape test, whereas "Fail" indicates that the tape removed portions of the tungsten film. As can be seen from the data, the multi-pulse diborane treatment of a tungsten nucleation layer yields a tungsten film with lower resistivity and better sheet resistance uniformity (i.e., lower percent non-uniformity) than the single pulse treatment, while maintaining good adhesion.

TABLE II

Comparison of 510 Angstrom thick tungsten films on titanium nitride barrier layers on 300 mm wafers prepared using a single pulse and a multi-pulse reducing agent treatment.

| Process | Number of pulses | Pulse time (sec) | Resistivity (μohm-cm) | Non-Uniformity (%) | Adhesion |
|---|---|---|---|---|---|
| Single pulse | 1 | 6 | 13.42 | 11.55 | Pass |
| Multi-pulse | 6 | 1 | 11.95 | 4.98 | Pass |

As shown in Table II and as described further below with respect to FIGS. 2 and 3, using separate pulses of diborane unexpectedly results in a tungsten film with better resistivity and uniformity, while still having good adhesion. As noted above, the total diborane dosages for each wafer in Table II are equivalent. The only difference in the multi-pulse and the single pulse treatments shown in Table II is that the multi-pulse treatment is broken up into separate, smaller pulses of diborane, yet significant improvements in resistivity and uniformity are observed.

Figure 2:
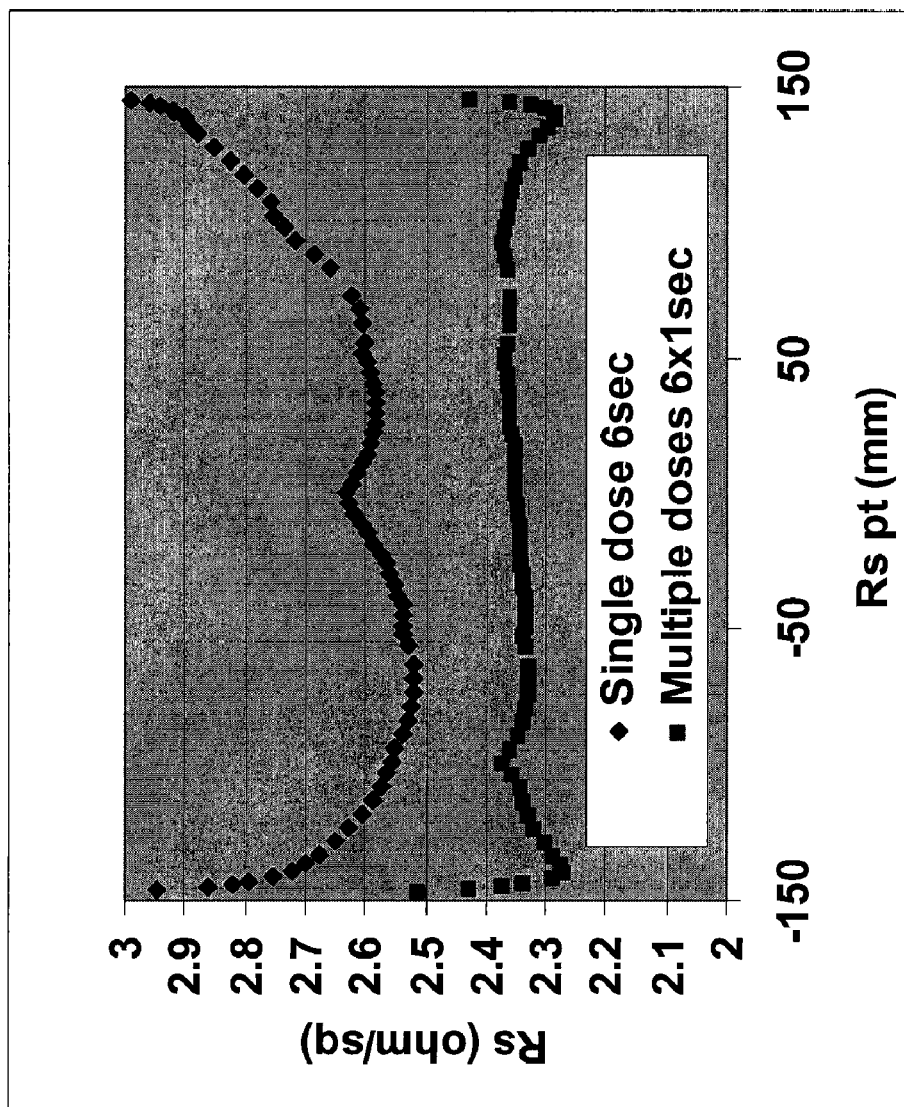
FIG. 2 is a graph of tungsten film sheet resistance across a wafer for tungsten films formed with a single pulse and a multi-pulse reducing agent treatment.

FIG. 2 is a graph of tungsten film sheet resistance across the wafers for tungsten films formed with a single pulse and a multi-pulse reducing agent treatment. The data displayed in this graph was taken from the same wafers discussed in Table II. As can be seen from the data, the multi-pulse diborane treatment lowers the resistance at both the edges of the wafer and at the center of the wafer, as well as reducing the differences in the resistance from the edge compared to the center. This results in a lower resistance non-uniformity for the multi-pulse diborane treatment compared to the single pulse treatment.

Figure 3:
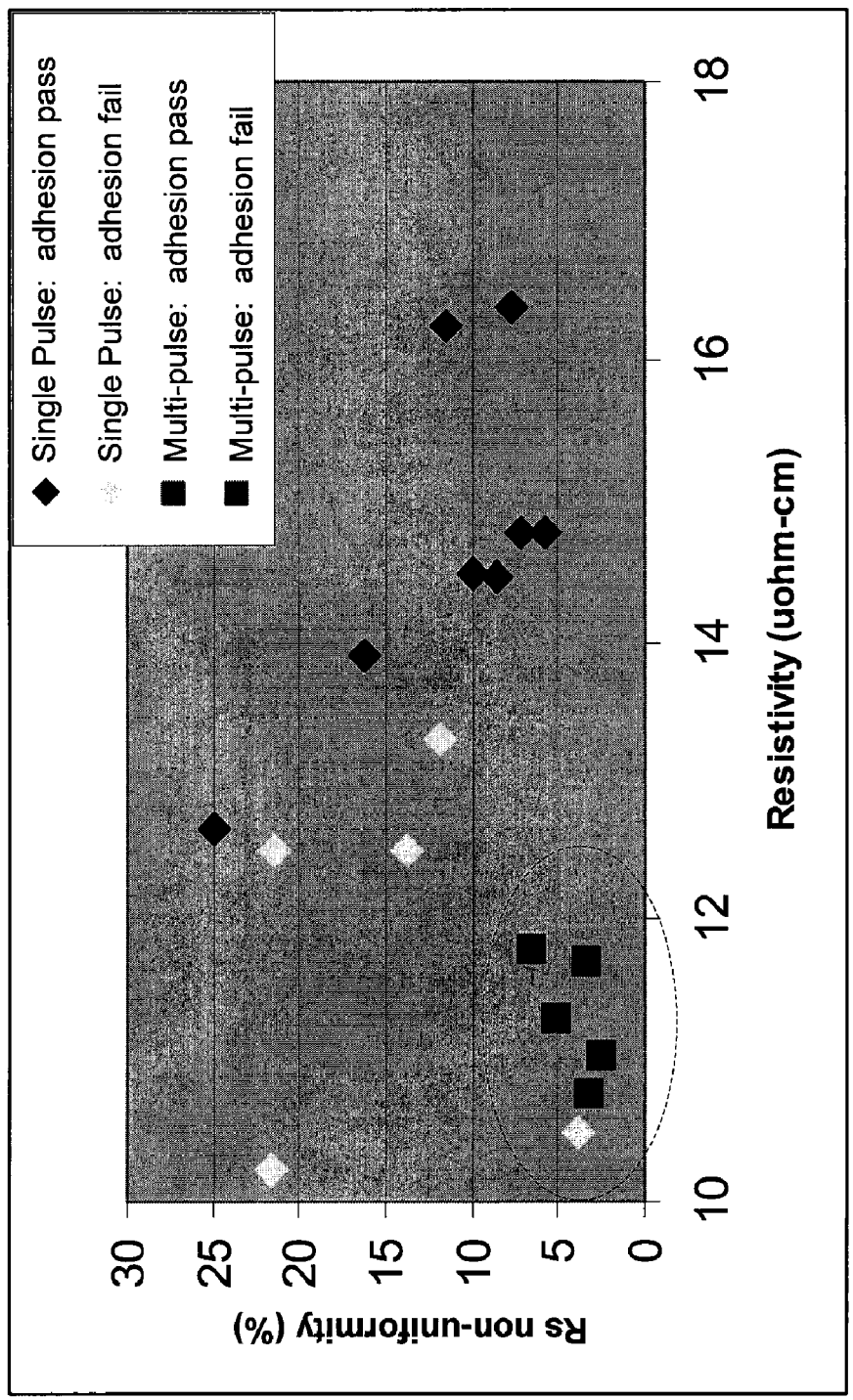
FIG. 3 is a graph of sheet resistance non-uniformity versus resistivity for a number of tungsten films formed with single pulse and multi-pulse reducing agent treatments.

FIG. 3 is a graph of sheet resistance percent non-uniformity versus resistivity for a number of tungsten films formed with single pulse and multi-pulse reducing agent treatments. The tungsten films represented by the data points were deposited on different barrier layer materials and the tungsten nucleation layers were treated with different gas flows. Even with these variations between the tungsten films, the tungsten films formed with a multi-pulse reducing agent treatment exhibit superior properties compared to the films formed with a single pulse treatment. All of the multi-pulse treatment films, enclosed within the oval on the graph, have low sheet resistance percent non-uniformity and low resistivity. Adhesion results for the multi-pulse treatments are also good, with failure for only one of the tungsten films formed with a multi-pulse treatment. The tungsten films formed with a single pulse reducing agent treatment, on the other hand, generally either have poor sheet resistance percent non-uniformity or high resistivity. In the one single pulse reducing agent treatment film with low sheet resistance non-uniformity and low resistivity (data point in the oval), the adhesion failed.

The gas flow rate of the reducing agent during a pulse is preferably between about 100 to 500 sccm. The pulse time of each reducing agent pulse varies from between about 0.5 to 5 seconds, and more preferably between about 1 to 2 seconds. The interval time between each reducing agent pulse of the plurality of reducing agent pulses is preferably between about 2 to 5 seconds. For these operating conditions, the number of reducing agent pulses is preferably between 2 and 8. Chamber pressure can vary broadly during the multi-pulse reducing agent treatment, between about 2 and 100 Torr, and more preferably between about 20 and 40 Torr. These reducing agent pulse parameters are based on 300 mm wafers and may need to be adjusted depending on the wafer size, particular processing equipment, particular reducing agent used, etc. After the reducing agent pulses, a tungsten bulk layer is deposited on the nucleation layer. The resulting tungsten film has low resistivity, good sheet resistance uniformity, and good adhesion compared to a thin film formed with exposure of the nucleation layer to a single reducing agent pulse.

It has been found that depending on the pulse time, pulse dose, and interval time, there exists an optimum number of pulses to use to obtain the desired tungsten film properties. If too few pulses are used, the resistivity and sheet resistance uniformity of the tungsten film are poor. If too many pulses are used, the resistivity and uniformity of the tungsten film are good, but adhesion is poor. In many embodiments, the optimum is between 2-8, though the optimum number of pulses depends on the operating conditions used. A significantly higher number of pulses may be used for significantly different processing conditions.

Figure 1C:
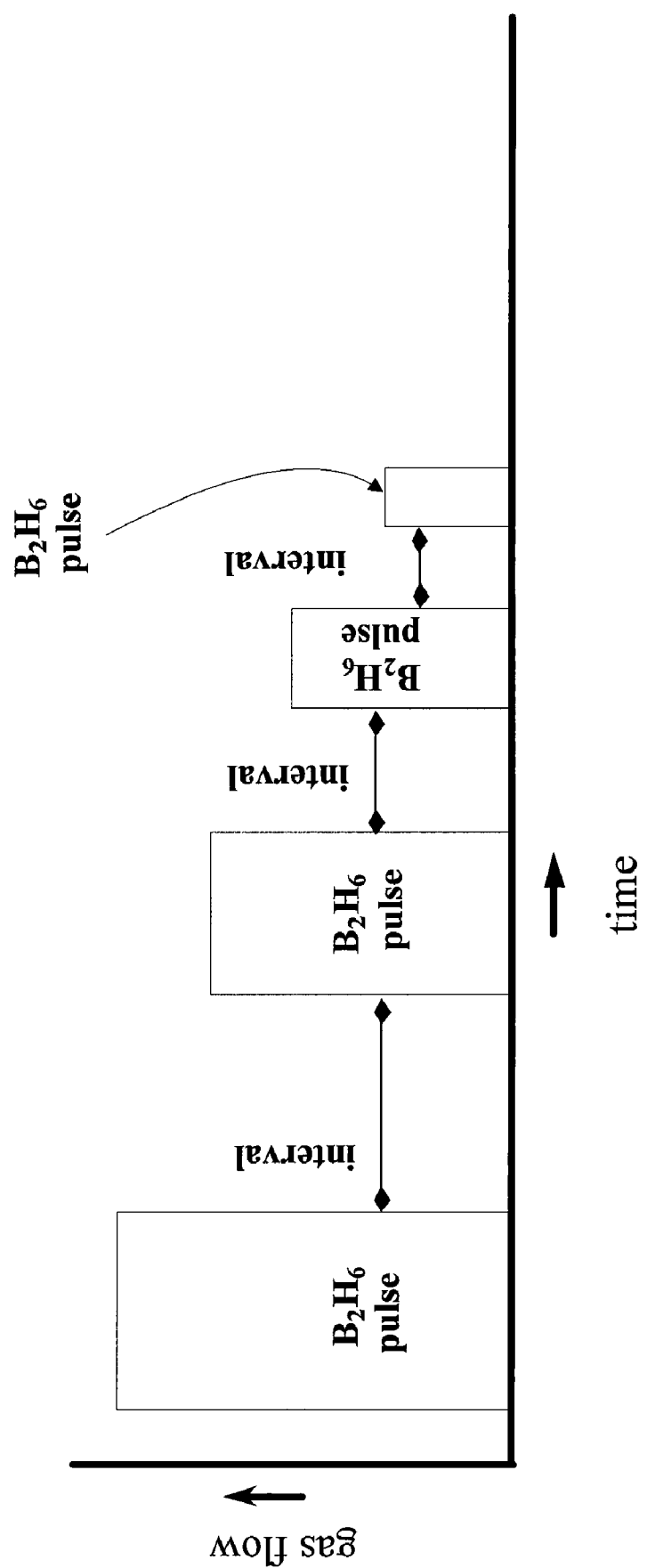

In embodiments in which the tungsten nucleation layer is exposed to multiple pulses, the pulses may be identical or may be varied from pulse to pulse. FIG. 1C shows an example of a graph representing varied reducing agent pulses and interval times in accordance with certain embodiments. As above, the vertical axis represents gas flow rate and the horizontal axis represents time, as divided into stages associated with the various steps of the process. In FIG. 1C, the reducing agent pulse time is varied and is decreasing with each subsequent pulse. Also, in FIG. 1C, the gas flow rate during each reducing agent pulse is varied and is decreasing with each subsequent pulse. Furthermore, in FIG. 1C, the interval time between the pulses is varied and is decreasing with each subsequent pulse. The reducing agent pulse times, the reducing agent gas flow rates, and the interval times may be independently varied to optimize throughput and/or to further improve the resistivity, uniformity and adhesion of a tungsten film.

For example, pulse flow rates, pulse times, and/or interval times may be varied to account for differential adsorption rates of the reducing agent onto the substrate surface. In certain embodiments, pulse time and/or flow rate may be reduced without a significant loss in reducing agent coverage of the substrate, but with an increase in throughput. Although the example in FIG. 1C shows flow rate, pulse time and interval time all decreasing, these may be independently decreased, increased, or otherwise varied. In certain embodiments, for example, two flow rates and/or pulse times may be used; one for the initial pulse and one for all subsequent pulses.

Figure 4:
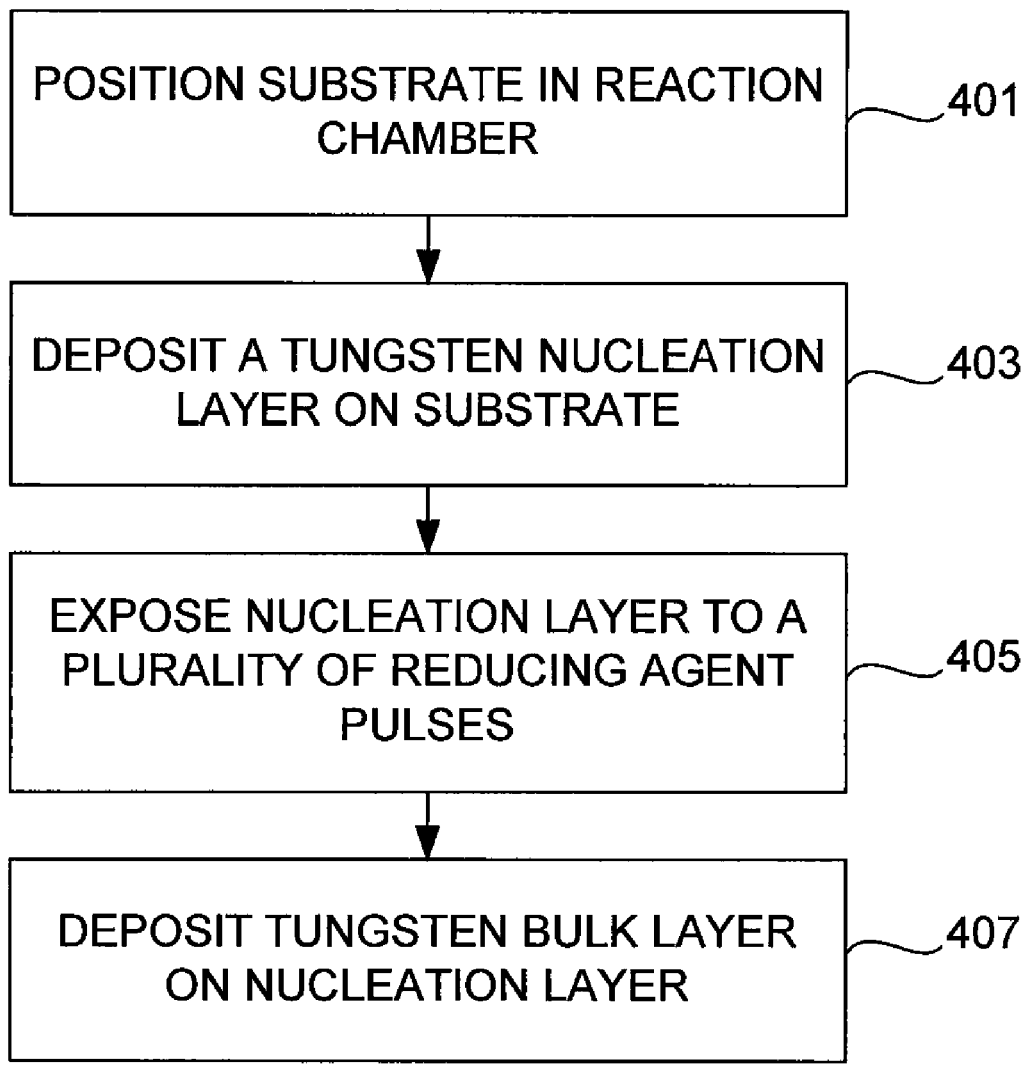
FIGS. 4-6 are process flow sheets showing relevant operations or methods according to various embodiments of the invention.

FIG. 4 is a flow chart depicting one process flow in accordance with certain embodiments of the invention. Initially, a substrate is provided and positioned in a reaction chamber as indicated by process block 401. In many embodiments of the invention the substrate is a partially fabricated electronic device (e.g., a partially fabricated integrated circuit). In some embodiments, the substrate may be coated with a titanium nitride layer (deposited, e.g., by physical vapor deposition (PVD) or by a CVD process employing titanium tetrachloride). The tungsten nucleation layer is deposited on this layer.

Next, as indicated by a process block 403, a tungsten nucleation layer is deposited on the substrate. In certain embodiments, a pulsed nucleation layer (PNL) process is used to deposit the tungsten nucleation layer. In a PNL deposition process, pulses of reducing agent, purge gases and tungsten-containing precursors are sequentially injected into and purged from the reaction chamber. The process is repeated in a cyclical fashion until the desired nucleation layer thickness is achieved. PNL is similar to atomic layer deposition (ALD) techniques reported in the literature but is generally distinguished from ALD by its higher operating pressure range (greater than 1 Torr) and its higher growth rate per cycle (greater than 1 monolayer film growth per cycle). PNL processes as discussed herein encompass conventional ALD-type processes.

As discussed above, a tungsten nucleation layer is a thin conformal layer that facilitates growth of bulk tungsten. Tungsten nucleation layer thicknesses typically range from 10 to 30 Angstroms. Additional discussion regarding PNL type processes to deposit tungsten nucleation films can be found in commonly assigned U.S. patent application Ser. No. 11/265,531, incorporated herein by reference in its entirety for all purposes. Additional discussion regarding PNL type processes can also be found in commonly assigned U.S. Pat. Nos. 6,844,258, 7,005,372 and 7,141,494. Each of these patents is incorporated herein by reference in its entirety for all purposes. Additional methods of forming tungsten nucleation layers can be found in commonly assigned U.S. Pat. No. 6,905,543, incorporated herein by reference in its entirety for all purposes.

The next process operation 405 in FIG. 4 involves exposing the nucleation layer to pulses of a reducing agent. In certain embodiments, the reducing agent is diborane. Diborane and related compounds have been found to adsorb well to metal nitride surfaces such as titanium nitrides. Boranes do not adsorb on the substrate in a self-limiting manner. Diborane reacts on a substrate surface and decomposes into a boron film. The reaction can proceed as long as the substrate is continually exposed to diborane. Thus, the amount of adsorbed species is dependent on the diborane dosage. Typically, diborane is provided from a diluted source (e.g., 5% diborane and 95% nitrogen). Diborane may be delivered to the reaction chamber using other additional carrier gases such as argon, hydrogen and/or silane. Additionally, embodiments include an inert gas/hydrogen gas mixture that continuously flows into the reaction chamber during both the reducing agent pulse and interval times. In certain embodiments, the inert gas is argon. However, no other gases, other than a continuously flowing inert gas/hydrogen mixture or other background gas, flow into the reaction chamber during the interval time; i.e., there are no intervening pulse operations during the interval time between the reducing agent pulses. Exposure time of the nucleation layer to the reducing agent will vary depending in part upon dosages and chamber conditions. The reducing agent pulse time, interval time, and flow rate can all be varied, as described above with reference to FIG. 1C.

After the tungsten nucleation layer has been exposed to the reducing agent pulses, a tungsten bulk layer is deposited thereon as in operation 407. In many embodiments the tungsten bulk layer is deposited using a CVD process since CVD has been found to rapidly produce low resistivity films. Any suitable CVD process with any suitable tungsten-containing precursor may be used. In certain embodiments the tungsten precursor is one of $WF_6$, $WCl_6$ and $W(CO)_6$. Frequently, the CVD process is performed using a mixture of molecular hydrogen and one or more of these precursors. In other embodiments, the CVD process may employ a tungsten precursor together with silane, a mixture of hydrogen and silane, or a mixture of hydrogen and borane (such as diborane). Non-CVD process can also be employed to form the tungsten bulk layer. These include ALD, PNL, or PVD.

The tungsten bulk layer can be deposited to any thickness. Tungsten interconnect lines for integrated circuit applications may have a total thickness (tungsten nucleation layer and bulk tungsten) of between about 20 and 1,000 Angstroms. For a typical bit line, the total tungsten film thickness is typically no greater than about 500 Angstroms. After the tungsten film is deposited to a sufficient thickness, the process flow of FIG. 4 is complete. In certain embodiments, the operations 405 through 407 are repeated to deposit a tungsten film with reduced roughness.

Figure 5:
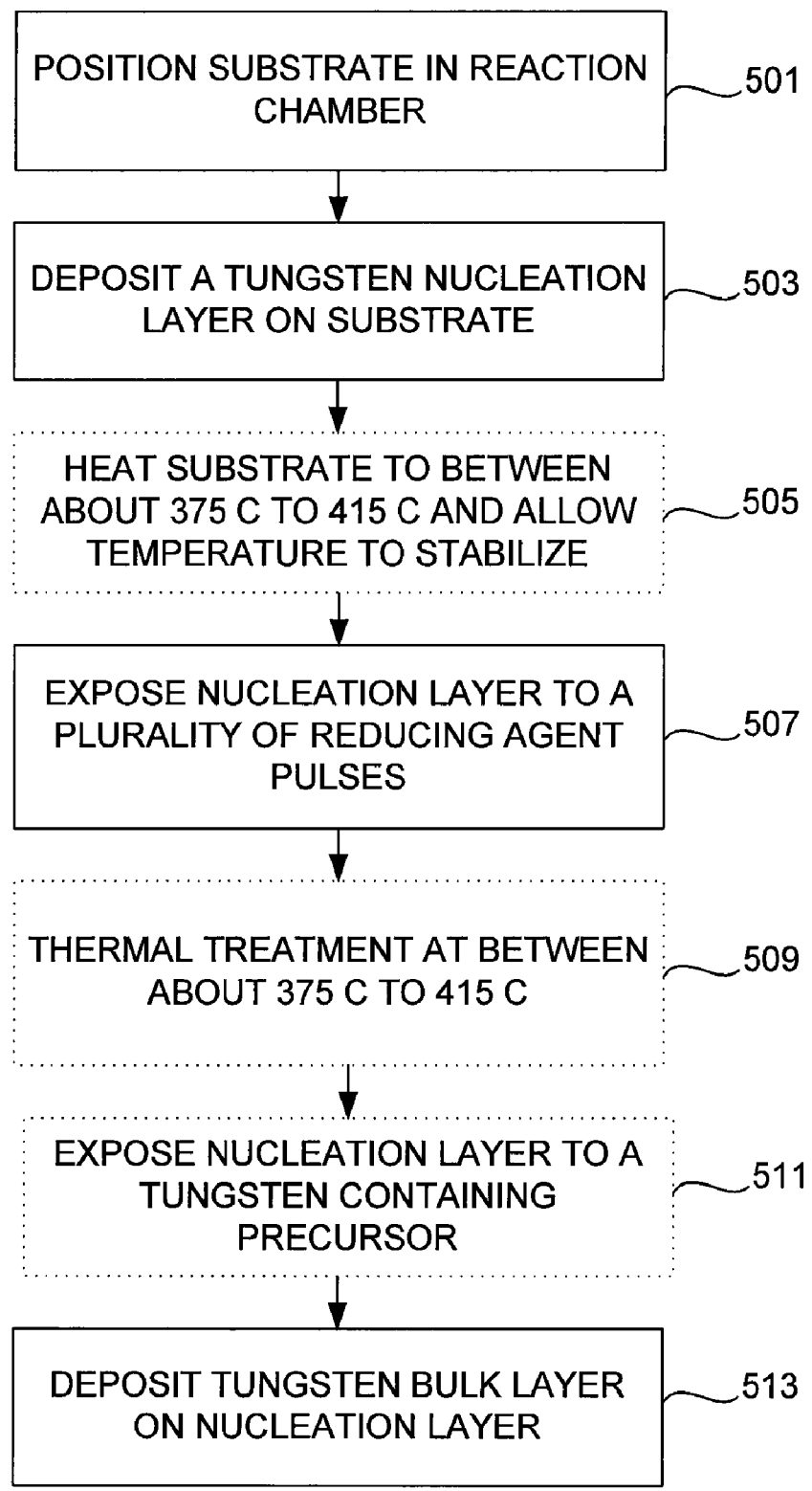

Another embodiment of the invention for forming a tungsten film is depicted in the flow chart of FIG. 5. The process flow in FIG. 5 is similar to the process flow in FIG. 4 with the exception of operations 505, 509 and 511, which may optionally be performed in implementing the process flow in FIG. 5.

As with the process depicted in FIG. 4, initially a substrate is provided and positioned in a reaction chamber as indicated by process block 501. Next, as indicated by a process block 503, a tungsten nucleation layer is deposited on the substrate.

As indicated by process block 505, the substrate is optionally heated to between about 375 C to 415 C, preferably about 395 C, and allowed to stabilize before exposing the nucleation layer to a plurality of reducing agent pulses in process operation 507. Then, as described above, the nucleation layer is exposed to a plurality of reducing agent pulses in process operation 507. Next, a thermal treatment is performed in process operation 509, where the substrate may be heated to between about 375 C to 415 C, preferably about 395 C. The preheat process operation 505 before exposing the nucleation layer to reducing agent pulses (process operation 507) and the thermal treatment process operation 509 after the reducing agent treatment yield a tungsten film with improved properties. The thermal treatment operation may involve a thermal soak at 395 C. Pre/post heat treatment could enhance film adhesion and improve sheet resistance percent non uniformity. While the process temperature in the example described here is 395 C, pre/post thermal treatments may also be used for other process temperatures.

Additionally, the nucleation layer may be exposed to a tungsten-containing precursor in process operation 511 to form another portion of the tungsten nucleation layer before depositing the tungsten bulk layer on the nucleation layer. Any suitable tungsten containing precursor may be used. In certain embodiments the tungsten precursor is one of $WF_6$, $WCl_6$, and $W(CO)_6$. The tungsten-containing precursor is typically provided in a dilution gas, such as argon, nitrogen, hydrogen, or a combination thereof. According to various embodiments, the temperature from block 505 to 511 may be constant or vary between different temperatures between about 250 to 415 C. In certain embodiments, the substrate temperature may be below about 350 C, for example between about 250 and 350 C or 275 and 350 C. Tungsten-containing precursor dosage and substrate exposure time will vary depending on a number of factors. This process operation may also improve the tungsten film properties.

Figure 6:
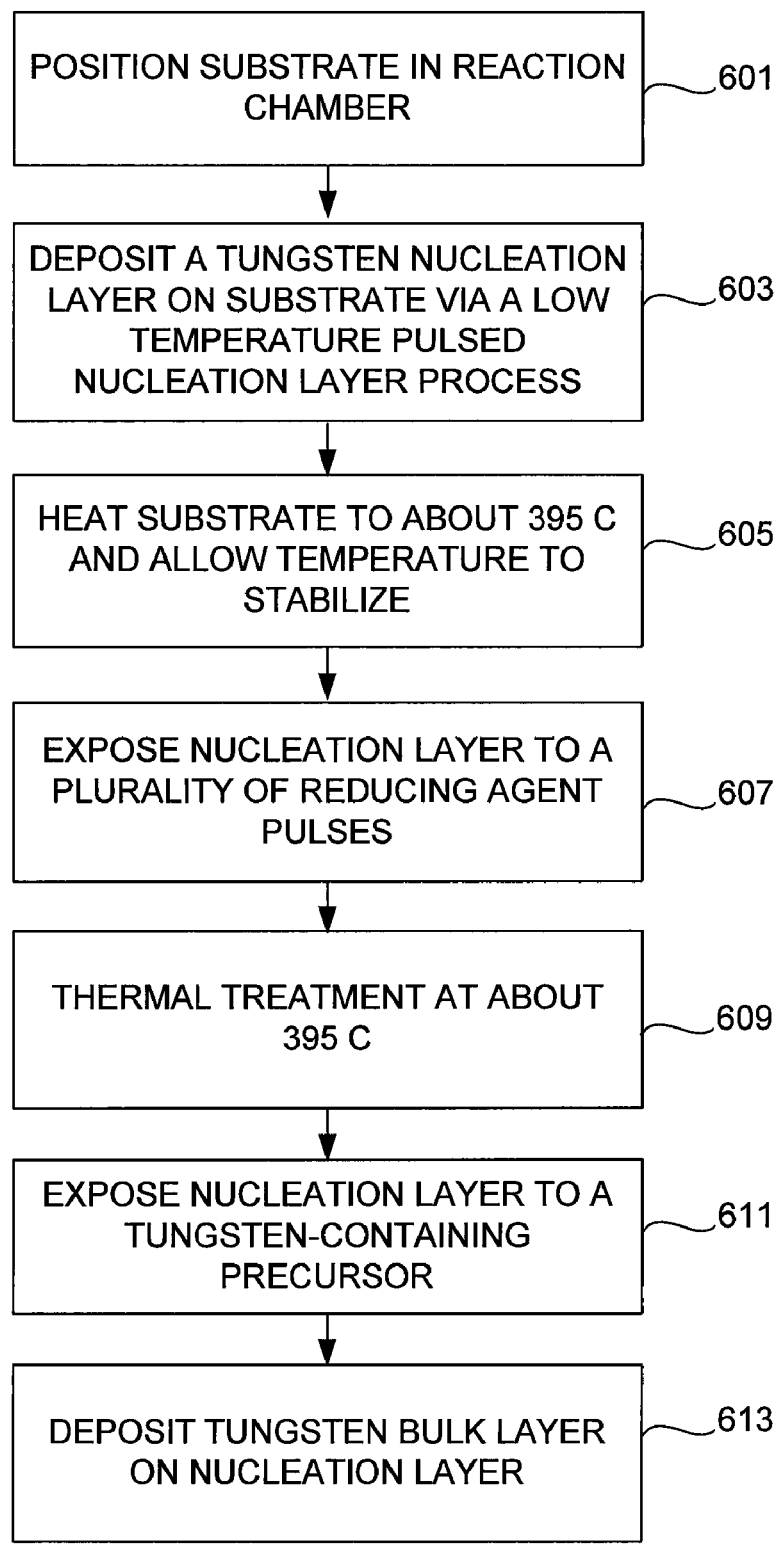

FIG. 6 depicts a specific embodiment of the method depicted in FIG. 5. Initially, a substrate is provided and positioned in a reaction chamber as indicated by process block 601. Next, as indicated by a process block 603, a tungsten nucleation layer is deposited on the substrate via a pulsed nucleation layer process at a low temperature, about 300 C. As indicated by process block 605, the substrate is heated to about 395 C and allowed to stabilize. Then, as described above, the nucleation layer is exposed to a plurality of diborane pulses in process operation 607. Next, in process operation 609, the substrate is thermally treated at about 395 C. The nucleation layer is then exposed to a tungsten-containing precursor in process operation 611. Any suitable tungsten containing precursor, typically provided in a dilution gas, may be used. In certain embodiments the tungsten precursor is one of $WF_6$, $WCl_6$, and $W(CO)_6$. The substrate temperature may be between about 250-415 C, and in certain embodiments below about 350 C, for example between about 250 and 350 C or 275 and 350 C. After the tungsten nucleation layer has been exposed to a tungsten-containing precursor, a tungsten bulk layer is deposited thereon in operation 613.

As noted above, tungsten nucleation layers typically have higher electrical resistivities than tungsten bulk layers. To keep the resistivity of the overall tungsten film (tungsten nucleation layer and bulk tungsten) low, the tungsten nucleation layer should be kept as thin as possible. As shown in FIG. 6, a PNL tungsten deposition process is used to form a thin nucleation layer. The nucleation layer is then exposed to a multi-pulse reducing agent treatment before bulk tungsten deposition. The resulting overall tungsten film has low resistivity and good uniformity while maintaining good adhesion.

Apparatus

The methods of the invention may be carried out in various types of deposition apparatus available from various vendors. Examples of suitable apparatus include a Novellus Concept 2 Altus, a Concept-2 Altus-S, a Concept 3 Altus deposition systems, all available from Novellus Systems, Inc. of San Jose, Calif., or any of a variety of other commercially available CVD processing systems. In some cases, the process can be performed on multiple deposition stations sequentially. See, e.g., U.S. Pat. No. 6,143,082, which is incorporated herein by reference for all purposes. In some embodiments, the tungsten nucleation layer deposition process is performed at a first station or at first and second stations that are one of two, four, five or even more deposition stations positioned within a single deposition chamber. The reducing gases and the tungsten-containing gases are alternately introduced to the surface of the semiconductor substrate at the first station, using an individual gas supply system that creates a localized atmosphere at the substrate surface.

Figure 7:
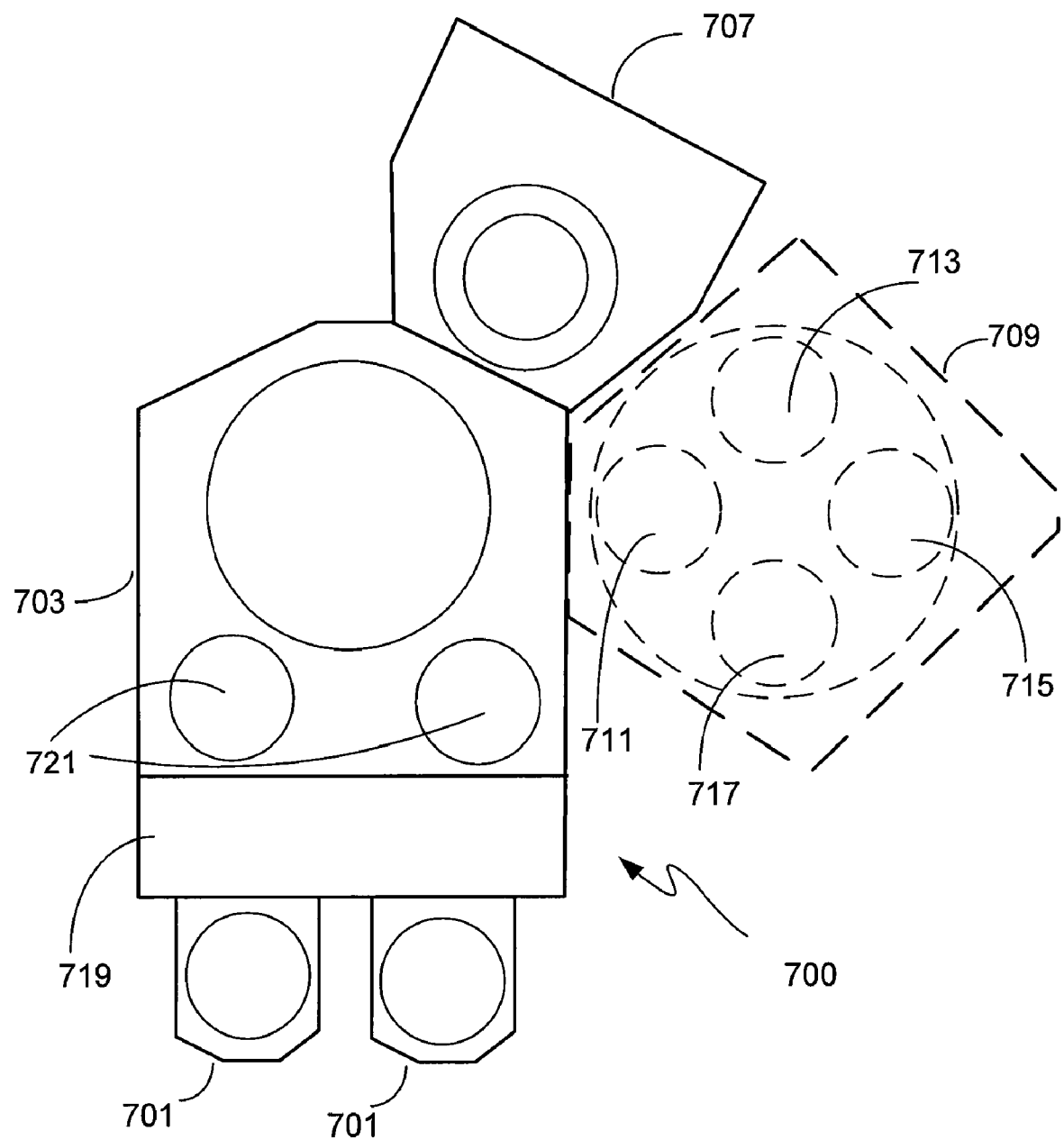
FIG. 7 is a block diagram of a processing system suitable for conducting tungsten deposition process in accordance with embodiments of the invention.

FIG. 7 is a block diagram of a CVD processing system suitable for conducting tungsten thin film deposition processes in accordance with embodiments of the invention. The system 700 includes a transfer module 703. The transfer module 703 provides a clean, pressurized environment to minimize the risk of contamination of substrates being processed as they are moved between the various reactor modules. Mounted on the transfer module 703 is a multi-station reactor 709 capable of performing PNL deposition, multi-pulse reducing agent treatment, and CVD according to embodiments of the invention. Chamber 709 may include multiple stations 711, 713, 715, and 717 that may sequentially perform these operations. For example, chamber 709 could be configured such that station 711 performs PNL deposition, station 713 performs multi-pulse reducing agent treatment, and stations 715 and 717 perform CVD.

Also mounted on the transfer module 703 may be one or more single or multi-station modules 707 capable of performing plasma or chemical (non-plasma) pre-cleans. The module may also be used for various other treatments, e.g., post liner tungsten nitride treatments. The system 700 also includes one or more (in this case two) wafer source modules 701 where wafers are stored before and after processing. An atmospheric robot (not shown) in the atmospheric transfer chamber 719 first removes wafers from the source modules 701 to loadlocks 721. A wafer transfer device (generally a robot arm unit) in the transfer module 703 moves the wafers from loadlocks 721 to and among the modules mounted on the transfer module 703.

In certain embodiments, a system controller is employed to control process conditions during deposition. The controller will typically include one or more memory devices and one or more processors. The processor may include a CPU or computer, analog and/or digital input/output connections, stepper motor controller boards, etc.

The controller may control all of the activities of the deposition apparatus. The system controller executes system control software including sets of instructions for controlling the timing, mixture of gases, chamber pressure, chamber temperature, wafer temperature, RF power levels, wafer chuck or pedestal position, and other parameters of a particular process. Other computer programs stored on memory devices associated with the controller may be employed in some embodiments.

Typically there will be a user interface associated with the controller. The user interface may include a display screen, graphical software displays of the apparatus and/or process conditions, and user input devices such as pointing devices, keyboards, touch screens, microphones, etc.

The computer program code for controlling the deposition and other processes in a process sequence can be written in any conventional computer readable programming language: for example, assembly language, C, C++, Pascal, Fortran or others. Compiled object code or script is executed by the processor to perform the tasks identified in the program.

The controller parameters relate to process conditions such as, for example, process gas composition and flow rates, temperature, pressure, plasma conditions such as RF power levels and the low frequency RF frequency, cooling gas pressure, and chamber wall temperature. These parameters are provided to the user in the form of a recipe, and may be entered utilizing the user interface.

Signals for monitoring the process may be provided by analog and/or digital input connections of the system controller. The signals for controlling the process are output on the analog and digital output connections of the deposition apparatus.

The system software may be designed or configured in many different ways. For example, various chamber component subroutines or control objects may be written to control operation of the chamber components necessary to carry out the inventive deposition processes. Examples of programs or sections of programs for this purpose include substrate positioning code, process gas control code, pressure control code, heater control code, and plasma control code.

A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. A pressure control program may include code for controlling the pressure in the chamber by regulating, e.g., a throttle valve in the exhaust system of the chamber. A heater control program may include code for controlling the current to a heating unit that is used to heat the substrate. Alternatively, the heater control program may control delivery of a heat transfer gas such as helium to the wafer chuck.

Examples of chamber sensors that may be monitored during deposition include mass flow controllers, pressure sensors such as manometers, and thermocouples located in pedestal or chuck. Appropriately programmed feedback and control algorithms may be used with data from these sensors to maintain desired process conditions.

The foregoing describes implementation of embodiments of the invention in a single or multi-chamber semiconductor processing tool.

Applications

Embodiment of the invention may be used to deposit thin, low resistivity tungsten films for many different applications. One preferred application is for interconnects in integrated circuits such as memory chips and microprocessors. Interconnects are current lines found on a single metallization layer and are generally long thin flat structures. These may be formed by a blanket deposition of a tungsten film (by a process as described above), followed by a patterning operation that defines the location of current carrying tungsten lines and removal of the tungsten from regions outside the tungsten lines.

A primary example of an interconnect application is a bit line in a memory chip. Of course, embodiments of the invention are not limited to interconnect applications and extend to vias, contacts and other tungsten structures commonly found in electronic devices. In general, embodiments of the invention find application in any environment where thin, low-resistivity tungsten films are required. Another primary example is a contact via.

Embodiments of the invention also focus on low resistivity, tungsten films having relatively thin proportions, typically on the order of 500 angstroms or less, preferably, 300 angstroms or less. But more generally, embodiments of the invention apply to a broader range of tungsten films, including those with thicknesses of between about 5 angstroms to 1000 angstroms. Thick films, typically around 2000 angstroms-3000 angstroms, but as high as around 4000 A may also be deposited. These thicker films (2000-4000 angstroms) are typically used for plugfill or plugfill+metal 1 lines, while thinner films are typically used for bitlines. In general, film thickness depends on the specific integration scheme.

Figure 8A:
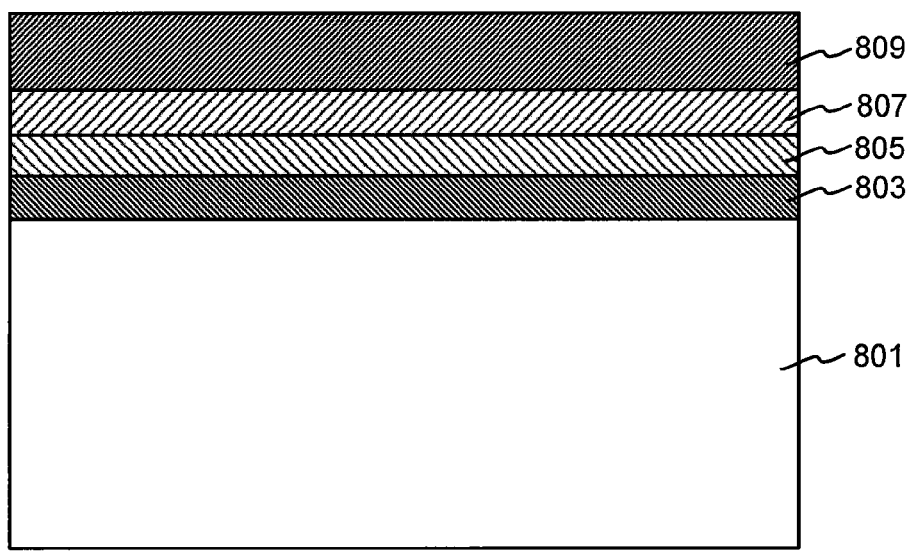
FIGS. 8A and 8B are schematics of film stacks including a tungsten nucleation layer and a tungsten bulk layer formed in accordance with embodiments of the invention.
Figure 8B:
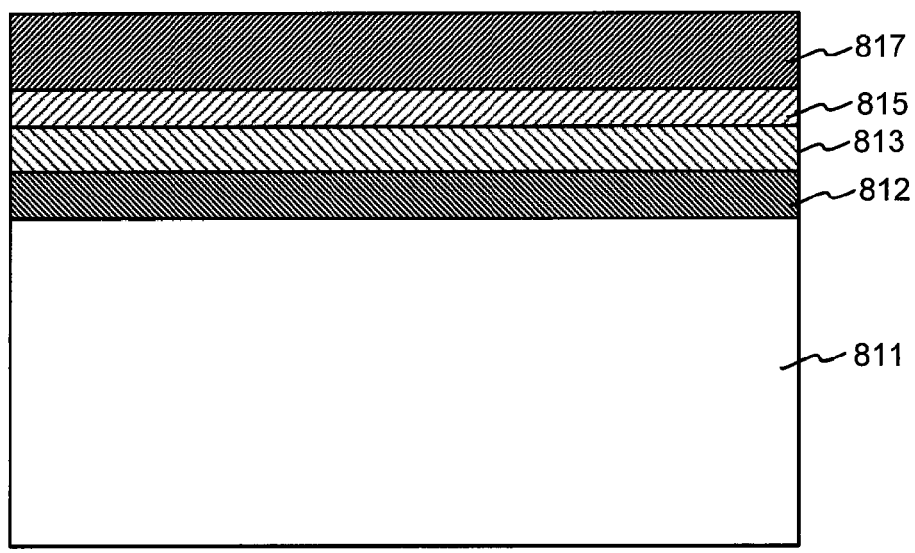

FIGS. 8A and 8B are cross-section illustrations of two different film stacks that can be formed using methods of the invention. Both film stacks may represent interconnect applications as described previously. The film stack of FIG. 8A is formed on an underlying substrate 801, which may be a single component or more commonly a complex multi-feature structure having various conductive, insulating, and semiconductor components. For example, substrate 801 may have a top layer comprising silicon or a dielectric such as silicon dioxide. Contacting substrate 801 is, in the following order, a titanium layer 803, a titanium nitride layer 805, a tungsten nucleation layer 807 and a tungsten bulk layer 809 (formed in accordance with embodiments of the invention). Titanium layer 803 is typically deposited by a CVD process which provides reasonably good adhesion to the underlying substrate 801. Titanium nitride layer 805 is typically deposited using CVD or PVD methods and is used to protect the underlying titanium and/or silicon from exposure to tungsten hexafluoride ($WF_6$) during subsequent tungsten deposition. It has been found that $WF_6$ reacts very aggressively and sometimes explosively with titanium. Tungsten nucleation layer 807 is preferably formed with a pulse nucleation process. Tungsten bulk layer 809 is formed in accordance with embodiments of the invention as described above. In interconnect applications as described above, layers 803, 805, 807 and 809 are all etched to form interconnect lines.

The film stack of FIG. 8B is similar to that of FIG. 8A in that there is an underlying substrate 811 (comprising, for example, silicon and/or silicon dioxide), a tungsten nucleation layer 815 and a tungsten bulk layer 817. However, instead of titanium and titanium nitride layers, a tungsten layer 812 and a tungsten nitride layer 813 are employed. The nitride layer 813 is used to protect the underlying silicon from exposure to $WF_6$ and is typically deposited using a CVD or PVD process which provides reasonably good adhesion to the underlying silicon or dielectric substrate, but does not necessarily provide a sufficiently high quality layer to serve as an interconnect. As in the film stack of FIG. 8A, all of the layers 812, 813, 815 and 817 are etched to form interconnect lines.

OTHER EMBODIMENTS

While this invention has been described in terms of several embodiments, there are alterations, modifications, permutations and substitute equivalents which fall within the scope of the invention. It should also be noted that there are many alternative ways of implementing the methods and apparatuses of the invention. It is therefore intended that the following appended claims be interpreted as including all such alterations, modification, permutations, and substitute equivalents as fall within the true spirit and scope of embodiments of the invention.

Embodiments of the invention have been described for forming tungsten thin films with low resistivity, good uniformity and good adhesion. The methods as described herein are also applicable to forming other metallic films, including copper and aluminum, with low resistivity, good uniformity and good adhesion.

What is claimed is:

1. A method of forming a tungsten film on a substrate in a reaction chamber, the method comprising:
    (a) positioning the substrate in the reaction chamber;
    (b) depositing a tungsten nucleation layer on the substrate;
    (c) after completing deposition of the tungsten nucleation layer, treating the surface of the deposited nucleation layer by exposing the surface to a plurality of reducing agent pulses without an intervening pulse operation between the pulses, wherein each pulse in the plurality of reducing agent pulses has a pulse time and the pulse time of at least two reducing agent pulses is different; and
    (d) depositing a tungsten bulk layer over the tungsten nucleation layer to form the tungsten film.

2. The method of claim 1 wherein the reducing agent is a boron-containing reducing agent.

3. The method of claim 1 wherein the reducing agent is diborane.

4. The method of claim 1 wherein the number of reducing agent pulses in step (c) is 2 to 8.

5. The method of claim 1 further comprising:
    heating the substrate to between about 375 C to 415 C and allowing the temperature to stabilize prior to step (c), wherein the temperature is maintained between about 375 C to 415 C during step (c).

6. The method of claim 1 further comprising heating the substrate to between about 375 C to 415 C prior to step (d).

7. The method of claim 1 further comprising exposing the nucleation layer to a tungsten-containing precursor prior to step (d).

8. The method of claim 1 wherein each pulse in the plurality of reducing agent pulses in step (c) has a pulse time and the pulse time is between about 0.5 to 5 seconds.

9. The method of claim 1 wherein an interval time between reducing agent pulses in step (c) is between about 2 to 5 seconds.

10. The method of claim 1 wherein each pulse in the plurality of reducing agent pulses has a flow rate and the flow rate is between about 100 to 500 sccm.

11. The method of claim 1 wherein the tungsten film formed on the substrate has a sheet resistance percent non-uniformity of less than 5%.

12. The method of claim 1 wherein the tungsten film formed on the substrate has a resistivity of less than about 15 micro-ohms-cm for 500 Angstrom thick tungsten film.

13. A method of forming a tungsten film on a substrate in a reaction chamber, the method comprising:
- (a) positioning the substrate in the reaction chamber;
- (b) depositing a tungsten nucleation layer on the substrate;
- (c) after completing deposition of the tungsten nucleation layer, treating the surface of the deposited nucleation layer by exposing the surface to a plurality of reducing agent pulses without an intervening pulse operation between the pulses, wherein an interval time between reducing agent pulses is different for at least two interval times; and
- (d) depositing a tungsten bulk layer over the tungsten nucleation layer to form the tungsten film.

14. A method of forming a tungsten film on a substrate in a reaction chamber, the method comprising:
- (a) positioning the substrate in the reaction chamber;
- (b) depositing a tungsten nucleation layer on the substrate;
- (c) after completing deposition of the tungsten nucleation layer, treating the surface of the deposited nucleation layer by exposing the surface to a plurality of reducing agent pulses without an intervening pulse operation between the pulses, wherein an interval time between reducing agent pulses decreases with each subsequent pulse; and
- (d) depositing a tungsten bulk layer over the tungsten nucleation layer to form the tungsten film.

15. A method of forming a tungsten film on a substrate in a reaction chamber, the method comprising:
- (a) positioning the substrate in the reaction chamber;
- (b) depositing a tungsten nucleation layer on the substrate;
- (c) after completing deposition of the tungsten nucleation layer, treating the surface of the deposited nucleation layer by exposing the surface to a plurality of reducing agent pulses without an intervening pulse operation between the pulses wherein each reducing agent pulse in the plurality of reducing agent pulses has a flow rate and the flow rate of at least two reducing agent pulses is different; and
- (d) depositing a tungsten bulk layer over the tungsten nucleation layer to form the tungsten film.

* * * * *